(12) United States Patent
Greiser

(10) Patent No.: US 9,791,532 B2
(45) Date of Patent: Oct. 17, 2017

(54) METHOD AND APPARATUS FOR MAGNETIC RESONANCE IMAGING

(71) Applicant: Siemens Aktiengesellschaft, Munich (DE)

(72) Inventor: Andreas Greiser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 393 days.

(21) Appl. No.: 14/484,658

(22) Filed: Sep. 12, 2014

(65) Prior Publication Data

US 2015/0070015 A1  Mar. 12, 2015

(30) Foreign Application Priority Data

Sep. 12, 2013  (DE) .................. 10 2013 218 281

(51) Int. Cl.
| | | |
|---|---|---|
| *G01R 33/36* | (2006.01) | |
| *G01R 33/54* | (2006.01) | |
| *G01R 33/50* | (2006.01) | |
| *G01R 33/567* | (2006.01) | |

(52) U.S. Cl.
CPC .......... *G01R 33/543* (2013.01); *G01R 33/36* (2013.01); *G01R 33/50* (2013.01); *G01R 33/5673* (2013.01)

(58) Field of Classification Search
CPC .. G01R 33/50; G01R 33/4828; G01R 33/465; G01R 33/5602; G01R 33/1284; G01R 33/4838; G01R 33/5608; G01R 33/5618; G01R 33/56341; G01R 33/5676; G01R 33/58; G01R 33/5601; G01R 33/5607; G01R 33/5616; G01R 33/5617; G01R 33/563; A61B 5/055; A61B 2576/026; A61B 5/0042; A61B 5/044; A61B 5/7289
See application file for complete search history.

(56) References Cited

U.S. PATENT DOCUMENTS

| | | |
|---|---|---|
| 2005/0261576 A1 | 11/2005 | Speier et al. |
| 2008/0081986 A1 | 4/2008 | Slavin |
| 2014/0128720 A1* | 5/2014 | Gallez .................... A61B 5/055 600/411 |
| 2014/0200436 A1* | 7/2014 | Weingartner .......... A61B 5/055 600/413 |

OTHER PUBLICATIONS

Messroghli et al., "High-resolution T1 mapping of the myocardium within a single breath-hold", Proc. Intl. Soc. Mag. Reson. Med. 11, p. 168 (2004).

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus for magnetic resonance imaging, in order to create a T1 map, an pulse sequence is used that includes at least one exposure cycle, wherein the exposure cycle includes an inversion pulse, a saturation pulse quantity of one or more saturation pulses and a readout step quantity of one or more readout steps. Within the exposure cycle, at least one saturation pulse of the saturation pulse quantity follows the inversion pulse and at least one readout step of the readout step quantity follows the at least one saturation pulse.

10 Claims, 2 Drawing Sheets

(56) References Cited

OTHER PUBLICATIONS

Piechnik et al., "Shortened Modified Look-Locker Inversion recovery (ShMOLLI) for clinical myocardial T1-mapping at 1.5 and 3 T within a 9 heartbeat breathhold", Journal of Cardiovascular Magnetic Resonance, 12(1), pp. 1-11 (2010).

Ugander et al., "Myocardial extracellular volume imaging by CMR quantitatively characterizes myocardial infarction and subclinical myocardial fibrosis", Journal of Cardiovascular Magnetic Resonance, vol. 13 (Suppl 1), p. 148 (2011).

Weingartner et al., "Heart-rate independent myocardial T1-mapping using combined saturation and inversion preparation pulses", Journal of Cardiovascular Magnetic Resonance, 15 (Suppl 1), p. 46 (2013).

Chow et al., "T2-dependent errors in MOLLI T1 values: simulations, phantoms, and in-vivo studies", Journal of Cardiovascular Magnetic Resonance, 14 (Suppl 1), p. 281 (2012).

Greiser et al., Cardiac Motion-Corrected Inversion Prepared Real-Time ("TIRT") Cine TrueFISP Imaging for Rapid Myocardial T1 Estimation, SMRM (2012).

Weingärtner. et al. Combined saturation/inversion recovery sequences for improved evaluation of scar and diffuse fibrosis in patients with arrhythmia or heart rate variability: Magn. Reson. Med. vol. 71; pp. 1024-1034; (2014).

\* cited by examiner

METHOD AND APPARATUS FOR MAGNETIC RESONANCE IMAGING

BACKGROUND OF THE INVENTION

Field of the Invention

The invention concerns a method for magnetic resonance imaging, as well as a magnetic resonance imaging apparatus that operates according to such a method, as well as a non-transitory, computer-readable data storage medium encoded with programming instructions that cause such a method to be implemented, when a storage medium is loaded into a control computer of a magnetic resonance apparatus.

Description of the Prior Art

In magnetic resonance imaging, frequently T1 relaxation times are quantitatively determined and spatially resolved as a T1 map. The T1 relaxation time, also called spin-lattice relaxation time, is the time that the longitudinal magnetization of the nuclear spins requires in order to return to approximately 63% of its initial value after an excitation from the state of equilibrium. Exposure sequences are used for the preparation of T1 maps. Such sequences sample (i.e. detect signals representing) the relaxation of the longitudinal magnetization back to the state of equilibrium after a preparation pulse.

From the publication Messroghli et al., "High-resolution T1 mapping of the myocardium within a single breathhold", Proc. Intl. Soc. Mag. Reson. Med. 2004, 11, 168 an pulse sequence for creation of a T1 map is known, in which only inversion pulses are used for preparation of the longitudinal magnetization.

From the publication Chow et al., "T2-dependent errors in MOLLI T1 values: simulations, phantoms, and in-vivo studies:, Journal of Cardiovascular Magnetic Resonance 2012, 14 (Suppl 1), 281 an pulse sequence for creation of a T1 map is known in which only saturation pulses are used for preparation of the longitudinal magnetization.

From the publication Weingartner et al., "Heart-rate independent myocardial T1-mapping using combined saturation and inversion preparation pulses", Journal of Cardiovascular Magnetic Resonance 2013, 15 (Suppl 1), 46 an pulse sequence for the creation of a T1 map is known, in which inversion pulses for the preparation of the magnetization are used. Prior to the inversion pulses, saturation pulses are used in order to dephase the longitudinal magnetization in the imaging volume.

SUMMARY OF THE INVENTION

An object of the invention is to provide an improved pulse sequence for the creation of a T1 map.

The invention proceeds from a method for magnetic resonance imaging of an examination object using an pulse sequence that has at least one exposure cycle, wherein the exposure cycle includes an inversion pulse, a saturation pulse quantity of one or more saturation pulses, and a readout step quantity of one or more readout steps, wherein, within the exposure cycle, at least one saturation pulse of the saturation pulse quantity follows the inversion pulse and at least one readout step of the readout step quantity follows the at least one saturation pulse.

The result of the execution of the method by a control computer so as to operate a magnetic resonance apparatus to acquire magnetic resonance image data from the examination object, is the compilation of a data file containing the acquired image data. The data file is available in electronic form in or from the control computer, for further processing thereof.

The examination object can be a patient. An pulse sequence typically includes a pulse sequence and/or is a pulse sequence. An exposure cycle can be a series of excitation pulses and readout steps that are repeated in cycles. An exposure cycle of the pulse sequence start with a relaxed longitudinal magnetization, also called magnetization in the z-direction. The longitudinal magnetization can for this purpose be uninfluenced in the case of the start of an exposure cycle of inversion pulses, saturation pulses and/or readout pulses. In order to achieve this, an exposure cycle can start long enough after the application of inversion pulses, saturation pulses and/or readout pulses. The start of an exposure cycle can also be triggered to the heartbeat of an examination object. In an exposure cycle a slice of a magnetic resonance image, in particular of a T1 map, can be acquired. In the pulse sequence several exposure cycles can be carried out and hence several layers of a magnetic resonance image can be acquired. An exposure cycle can be carried out during a breath holding procedure of the examination object.

An exposure cycle typically includes no more than one inversion pulse. An inversion pulse can rotate the longitudinal magnetization by at least 150° and a maximum of 210°, in particular by 180°. Thus the inversion pulse can cause a reversal of the longitudinal magnetization from positive to negative values. A saturation pulse can cause the longitudinal magnetization to be set broadly to zero. After application of a saturation pulse typically there is only a transverse magnetization. A saturation pulse can for this purpose be a spoiler gradient for dephasing of the longitudinal magnetization. A saturation pulse thus typically deletes any history in the longitudinal magnetization, since the saturation pulse typically sets the longitudinal magnetization to zero without consideration of the preceding values of the longitudinal magnetization.

The at least one readout step of the readout step quantity can follow the at least one saturation pulse directly, in particular without an inversion pulse interposed. The readout steps result in the acquisition of magnetic resonance signals or magnetic resonance data. The readout steps can be a True-FISP sequence. The readout steps can include special gradient switching (activation) and readout pulses. The readout steps, however, do not include inversion pulses or saturation pulses. The readout pulses of the readout steps can have a low flip angle, in particular less than 50°, preferably less than 40°, and most preferably less than 30°. The result is that the readout pulses exert only a slight effect on the longitudinal magnetization. Also, readout pulses, in contrast to a continuous acquisition of magnetic resonance signals, can keep the effect of the acquiring of magnetic resonance signals on the longitudinal magnetization.

The readout steps can be arranged for sampling of the relaxation curve of the longitudinal magnetization excited by the inversion pulse and the saturation pulses. With the use of the sampling values measured in the readout steps, a T1 relaxation time can be reconstructed. In the determination of T1 relaxation times, for example of the heart, in the method a broader value range of T1 relaxation times should be covered. The reason for this is the determination of the T1 relaxation times is typically performed before and after contrast medium administration and for specified parameters the T1 relaxation time of blood is included in the evaluation.

A value range of the T1 relaxation ties of 100 ms to 2000 ms, in particular a value range of 200 ms to 1500 ms should be covered.

In order to determine the T1 relaxation times, typically magnetic resonance signals with different inversion times, i.e. times between preparation of the longitudinal magnetization and the readout of the magnetic resonance signal are acquired. In order to cover short inversion times, within a short time period, for example a heartbeat, the magnetic resonance signal can be read out after a preparation pulse. The readout of the magnetic resonance signals repeated with several different inversion times in order to obtain a broad distribution of the sampling values of the relaxation curve for a good validity of the determined T1 relaxation times. If, in accordance with the aforementioned publications, only inversion pulses are used for preparation of the longitudinal magnetization, long waiting periods are necessary after each inversion pulse in order to obtain nearly identical initial magnetization for the following inversion pulse. The result is a long measurement time. If, in accordance with the aforementioned publications, only saturation pulses are used for preparation of the longitudinal magnetization, the dynamic range and hence the signal to noise ratio of the measured magnetic resonance signals is reduced.

Advantageously, both an inversion pulse and also saturation pulses serve as preparation of the longitudinal magnetization in accordance with the invention. The inversion pulse and the saturation pulses are for this purpose coordinated to one another. The inversion pulse can occur first, in order to exploit the full dynamic range of the relaxation of the longitudinal magnetization after the inversion pulse. The inversion pulse hence results in a good signal to noise ratio in the measured T1 relaxation times. The signal can be read out then until the longitudinal magnetization has reached a specified value, for example in the positive range. Instead of waiting for the full relaxation after the inversion pulse, a series of saturation pulses can then occur, followed by readout steps with different inversion times. Thus the relaxation curve of the longitudinal magnetization, in particular in the range of lower inversion ties, can be advantageously sampled. With the inventive combination of one inversion pulse and saturation pulses, the waiting time to the next inversion pulse can be bypassed. Hence the measurement time can be shortened. Also the advantages of the inversion pulse, namely the rapid sequence of the saturation pulses and readout steps for covering the short inversion times, can be combined with one another. The signal efficiency can thus be maximized and a suitable coverage of the relaxation curve can be achieved. Thus, T1 relaxation times can be determined with increased accuracy.

In an embodiment, at least one readout step of the readout step quantity takes place prior to the inversion pulse. During this readout step, magnetic resonance signals can be acquired without preparation of the longitudinal magnetization, that is, in a relaxed state of the longitudinal magnetization. The readout step can take place directly, in particular without an interposed inversion pulse or saturation pulse, after the start of the exposure cycle. The magnetic resonance signals acquired in this readout step are thus acquired to infinity with an inversion time and thus advantageously describe the limit of the convergence of the relaxation curve as compared with high inversion times.

In another embodiment, within the exposure cycle after the inversion pulse, at least two saturation pulses of the saturation pulse quantity and at least two readout steps of the readout step quantity occur without an interposed inversion pulse. The at least two saturation pulses and the at least two readout steps can take place on an alternating basis. In the readout steps thus magnetic resonance signals can be acquired with a longitudinal magnetization prepared directly by the saturation pulse.

In a further embodiment, the at least two saturation pulses and the at least two readout steps take place on an alternating basis and are coordinated to one another such that different inversion times ensue. An inversion time is, in the process typically the time between a readout step and the directly preceding preparation of the longitudinal magnetization by means of an inversion pulse or a saturation pulse. If the readout steps occur in a specified time interval, the saturation pulses advantageously have different time intervals, so that different inversion times ensue. The readout of the magnetic resonance signals with different inversion times leads to an increase in the number of sampling points on the relaxation curve of the longitudinal magnetization, and hence to a more accurate determination of the T1 relaxation time.

In another embodiment, the execution of the pulse sequence is coordinated to a heartbeat of the examination object such that, within the exposure cycle, the first of the at least one saturation pulses takes place within a time period of no more than 4 cardiac cycles after the inversion pulse. The measurement of the T1 relaxation times of the heart is advantageous, since disorders of the heart can be more precisely ascertained in the T1 maps. A cardiac cycle can be the repeating unit of the heartbeat. A cardiac cycle can in the method include the systole and the diastole. In an electrocardiogram a cardiac cycle can be the time period between two R waves. The first of the at least one saturation pulses can occur after the inversion pulse advantageously within a time period of no more than three cardiac cycles, most advantageously within a time period of no more than two cardiac cycles. Within the two to four cardiac cycles after the inversion pulse, the longitudinal magnetization prepared by the inversion pulse can be read out. Thus, with the method according to the invention, longer inversion times can be measured. The waiting period of no more than two to four cardiac cycles until a renewed preparation of the longitudinal magnetization by a saturation pulse leads to a shorter measurement time of the exposure sequence. The relaxation of the longitudinal magnetization does not have to be complete before the first of the at least one saturation pulses is applied.

In another embodiment, the readout step quantity includes several readout steps and the several readout steps are coordinated to a heartbeat of the examination object such that the several readout steps take place at consecutive cardiac cycles of the same heart phase of the examination object. The readout steps can thus take place in different cardiac cycles. The readout steps can take place at the same time in a cardiac cycle and/or in the same time period in a cardiac cycle relative to the beginning of the cardiac cycle. This has the advantage that the magnetic resonance signals acquired in the readout steps are each acquired in the same heart phase. Thus, the heart is always in the same general position in the acquisition of the magnetic resonance signals. Therefore, the influence of the movement of the heart on the magnetic resonance signals acquired in several readout steps is reduced.

In a further embodiment, the readout step quantity includes several readout steps, wherein registration of the reconstructed magnetic resonance images acquired from the magnetic resonance signals takes place in the several readout steps. This is especially necessary when the readout steps occur at different heart phases of consecutive cardiac cycles of the examination object. Then the movement of the heart can be compensated by means of the registration. Apart from that, in general registration of the magnetic resonance images is useful, since consequently an irregular heartbeat and/or a breathing movement of the examination object can be compensated.

In another embodiment, a quantitative, spatially resolved determination of the T1 relaxation time for the creation of a T1 map takes place from the magnetic resonance signals acquired in the readout steps of the readout step quantity. Hence, a magnetic resonance image can be reconstructed from the magnetic resonance signals acquired in the at least one readout step, wherein a T1 relaxation time is determined for each pixel of the magnetic resonance image.

The magnetic resonance apparatus according to the invention has a controller, and the controller is designed to execute the inventive method as described above.

The controller of the magnetic resonance apparatus can thus execute a method for magnetic resonance imaging of an examination object using an pulse sequence that includes at least one exposure cycle. For this purpose the controller has an inversion pulse generator for the generation of an inversion pulse of the exposure cycle, a saturation pulse generator for the generation of a saturation pulse quantity of the exposure cycle of one or more saturation pulses and a readout module for the generation of a readout quantity of the exposure cycle of one or more readout steps. The inversion pulse generator, the saturation pulse generator and the readout module are coordinated to one another such that within the exposure cycle at least one saturation pulse of the saturation pulse quantity follows the inversion pulse and at least one readout step of the readout step quantity follows the at least one saturation pulse.

The inversion generator, the saturation pulse generator and the readout module are, according to an embodiment, coordinated with one another such that at least one readout step of the readout step quantity occurs before the inversion pulse. The inversion pulse generator, the saturation pulse generator and the readout module are, according to another embodiment, coordinated with one another such that within the exposure cycle after the inversion pulse at least two saturation pulses of the saturation pulse quantity and at least two readout steps of the readout step quantity occur without interposed inversion pulses.

The inversion pulse generator, the saturation pulse generator and the readout module are, according to another embodiment, coordinated with one another such that the at least two saturation pulses and the at least two readout steps occur on an alternating basis and are coordinated to one another such that the readout steps follow the respective preceding saturation pulses such that different inversion times ensue.

The inversion pulse generator, the saturation pulse generator and the readout module are, according to another embodiment, coordinated with one another such that the execution of the pulse sequence is coordinated to a heartbeat of the examination object such that within the exposure cycle the first of the at least one saturation pulses takes place within a time period of no more than four cardiac cycles after the inversion pulse.

The inversion pulse generator, the saturation pulse generator and the readout module are, according to another embodiment, coordinated with one another such that the readout step quantity comprises several readout steps and the several readout steps are coordinated to a heartbeat of the examination object such that the several readout steps each occur at consecutive cardiac cycles of the examination object at the same heart phase.

The inversion pulse generator, the saturation pulse generator and the readout module are, according to another embodiment, coordinated with one another such that the readout step quantity includes several readout steps, wherein registration of the magnetic resonance images reconstructed from the magnetic resonance signals acquired in the several readout steps takes place.

The inversion pulse generator, the saturation pulse generator and the readout module are, according to another embodiment, coordinated with one another such that a quantitative spatially resolved determination of the T1 relaxation time occurs for creation of a T1 map from the magnetic resonance signals acquired in the readout steps of the readout quantity.

The controller can have additional control components which are necessary and/or advantageous for the execution of an inventive method. The controller can also be designed to send control signals to the magnetic resonance device and/or receive and/or process control signals in order to execute an inventive method. Computer programs and additional software can be stored on a storage unit of the controller, with which a processor of the controller automatically controls and/or executes a process sequence of an inventive method. The controller can be integrated in the magnetic resonance device. The controller can also be installed separately from the magnetic resonance device. The controller can be connected to the magnetic resonance device. The magnetic resonance device can advantageously execute an inventive method with the inventive controller. Embodiments of the inventive magnetic resonance apparatus are designed analogously to the embodiments of the inventive method. Hence the magnetic resonance device can execute an improved pulse sequence for the creation of a T1 map with an advantageous combination of saturation pulses and inversion pulses for the preparation of the longitudinal magnetization.

The invention also encompasses a non-transitory, computer-readable data storage medium that can be loaded directly into a memory of a programmable processing unit, and that is encoded with programming instructions (such as source code) in order to execute an inventive method when the programming instructions are executed in the processing unit of the magnetic resonance apparatus. As a result the inventive method can be executed rapidly, robustly and can be repeated identically. The processing unit must have the prerequisites such as, for example, an appropriate working memory, a corresponding graphics card or a corresponding logic unit, so that the respective steps of the method can be efficiently executed.

Examples of electronic readable data storage media are a DVD, a magnetic tape or a USB stick, upon which electronically readable control information, in particular software is stored.

DESCRIPTION OF THE PREFERRED EMBODIMENTS

Figure 1:
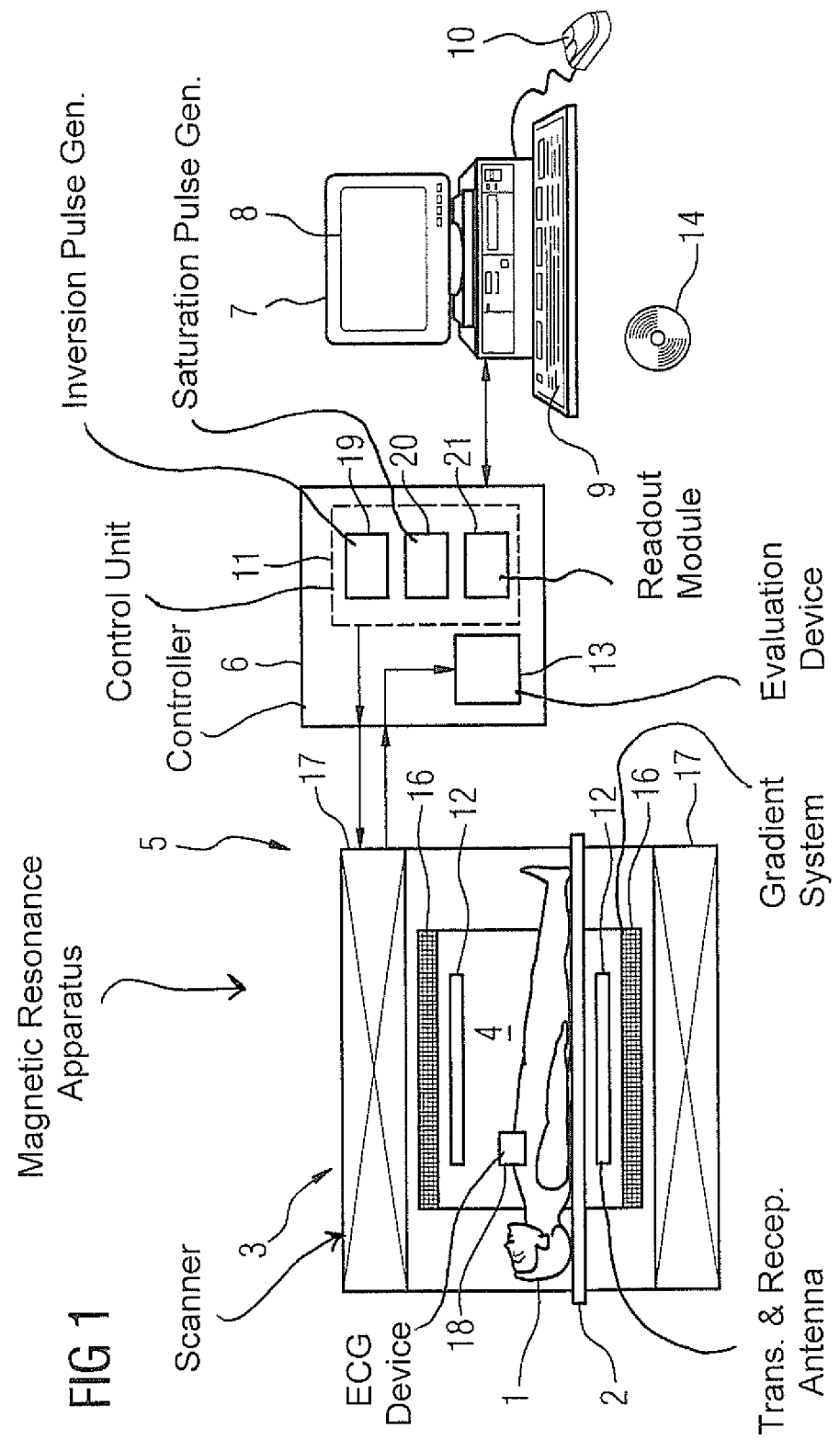
FIG. 1 schematically shows an inventive magnetic resonance apparatus for execution of the inventive method.

FIG. 1 schematically shows an inventive magnetic resonance apparatus 5 for the execution of the inventive method.

The magnetic resonance apparatus 5 has a scanner 3 with a magnet unit 17 and a gradient system 16, with which the magnetic fields necessary for a magnetic resonance examination are produced in a measuring volume 4. The magnetic resonance apparatus 5 further has a transmission and receiving antenna 12 for transmission of radio frequency excitation pulses, for example inversion pulses, saturation pulses or readout pulses, and for acquiring magnetic resonance signals. Additionally, the magnetic resonance apparatus 5 has a table 2 and a controller 6, with which the scanner 3 is controlled and magnetic resonance signals are recorded, and a terminal 7 connected to the controller 6.

The controller 6 has a control unit 11 and an evaluation device 13. During the creation of magnetic resonance images magnetic resonance signals are recorded by means of the scanner 3 from the transmission and receiving antenna 12. In the process the scanner 3, the table 2 and the gradient system 16 and the transmission and receiving antenna 12 are controlled by the control unit 11 such that magnetic resonance signals are recorded in a measurement volume in accordance with the inventive method. The measurement volume can in the process be located in the body cavity of a patient 1 lying on the table 2. The control takes place in accordance with an pulse sequence which has at least one exposure cycle which can be executed repeatedly. The control unit 11 has an inversion pulse generator 19 for the generation of inversion pulses. The control unit 11 further has a readout module 21 for the generation of readout pulses of the readout steps. The inversion pulse generator 19, the saturation pulse generator 20 and the readout module 21 are coordinated to one another such and designed such that the magnetic resonance device 5 can execute an inventive method in all of its embodiments.

An electrocardiogram of the patient 1 can be obtained by an ECG device 18. The electrocardiogram can supply information about the heartbeat of the patient 1. The electrocardiogram can be taken simultaneously during the acquisition of the magnetic resonance signals. The execution of the pulse sequence can be coordinated to the electrocardiogram taken by means of the ECG device 18 and hence to the heartbeat of the patient 1.

The evaluation device 13 records the acquired magnetic resonance signals and stores and processes them. The evaluation device 13 can carry out a registration of the magnetic resonance images acquired in the several readout steps. In addition, the evaluation device 13 can perform a quantitative spatially resolved determination of the T1 relaxation time from the acquired magnetic resonance signals and thus create a T1 map. The evaluation device 13 processes the read out magnetic resonance signals by executing a reconstruction algorithm such that they can be graphically presented on a display device, e.g. on a monitor 8 of the terminal 7. Along with the graphical rendering of the magnetic resonance images reconstructed from the magnetic resonance signals, with the terminal 7, which has, along with the monitor 8, an input device such as e.g. a keyboard 9 and/or a computer mouse 10, it is possible for a user e.g. to predefine a three-dimensional volume section to be measured as a measurement volume and to determine additional parameters for the performance of the inventive method.

The software (programming instructions) for the control device can be loaded into the controller via the terminal 7. This software of the controller 6 causes the inventive method to be executed. It is also possible for the inventive method to be embodied in a software program that runs in the terminal 7. Regardless of which software program the inventive method is in, the software can be stored on an electronically readable data storage device, such as e.g. a DVD 14, so that this software can then be read by the terminal 7 from the DVD 14 and be copied either to the controller 6 or to a processing unit of the terminal 7 itself.

Figure 2:
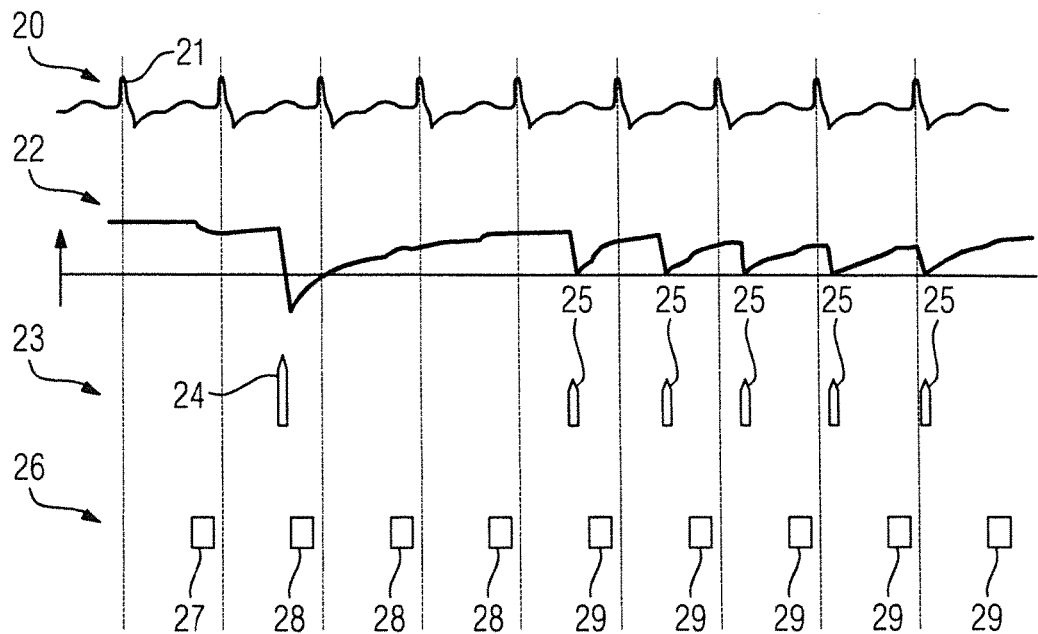
FIG. 2 shows an exposure cycle of an pulse sequence of a first embodiment of the inventive method.

FIG. 2 shows an exposure cycle of an exposure sequence of a first embodiment of an inventive method. In the first row 20 the time course of an ECG signal of a patient 1 acquired with ECG device 18 is shown. The cardiac cycles of the heartbeat of the patient 1 begin in each case with an R wave 21 of the ECG signal. The beginning of a cardiac cycle is in each case indicated by means of a vertical line through all rows. In the second row 22 the time course of the longitudinal magnetization is plotted. In the third row 23 the times are specified at which preparation pulses, namely inversion pulses 24 and saturation pulses 25, are applied by means of the transmission and receiving device 12. In the fourth row 26 the time periods are specified in which readout steps 27, 28, 29 occur, in which magnetic resonance signals are read out by means of the transmission and receiving device 12. The shown exposure cycle extends over nine cardiac cycles and includes the exposure of a layer of a magnetic resonance image, in particular of a T1 map. It can be repeated any number of times for the exposure of further layers.

The exposure cycle is started with the occurrence of an R wave 21 of the ECG signal. The exposure cycle begins with the R wave 21 of the ECG signal that directly precedes a further R wave 21 of the ECG signal, wherein the inversion pulse 24 of the exposure cycle directly follows the R wave. At the beginning of the exposure cycle the longitudinal magnetization is completely relaxed, i.e. in the shown case the longitudinal magnetization has a maximum positive value. A first readout step 27 occurs in the first cardiac cycle, which is carried out without preparation of the longitudinal magnetization. In this readout step magnetic signals are read out by means of the transmission and receiving device 12, said signals describing an inversion time to infinity and hence the convergence behavior of the relaxation curve for very great inversion times. The first readout step 27 and the further readout steps 28, 29 comprise in each case a true FISP sequence. In this connection, at each readout step readout pulses with a low flip angle of 35 are radiated by the transmission and receiving device 12. The low flip angle causes only a slight modification of the longitudinal magnetization, which is indicated in the second row 22.

In the second cardiac cycle an inversion pulse 24 is applied which causes a tilting of the longitudinal magnetization from the positive range to the negative range. The longitudinal magnetization thereupon relaxes again to its equilibrium state of complete relaxation, i.e. to its maximum positive value. During this relaxation magnetic resonance signals are read out in three readout steps 28 by means of the transmission and receiving device 12 over two subsequent, complete cardiac cycles. The magnetic resonance signal will be read out until the longitudinal magnetization has reached a specified positive value. In the process almost the complete dynamic range of the inversion pulse is utilized. The three readout steps 28, just as the first readout step 27 always occur at cardiac cycles of the patient 1, each succeeding the same heart phase. This ensures that the heart is always acquired in its same movement state. Hence movement artifacts are prevented in the magnetic resonance images which are reconstructed from the magnetic resonance signals acquired in the several readout steps 27, 28, and 29.

Before the relaxation of the longitudinal magnetization after the inversion pulse 24 is completely finished, in the fifth cardiac cycle a saturation pulse 25 is applied which sets the longitudinal magnetization to a value of zero. The longitudinal magnetization begins to relax again at its equilibrium state. Immediately thereafter a further readout step 29 is carried out. This readout step 29 serves the purpose of sampling the relaxation curve in the range of lower inversion times. In the four succeeding cardiac cycles a saturation pulse 25 and a further readout step 29 occur, in each case on an alternating basis. The saturation pulse 25 and the further readout steps 29 are coordinated to one another such that the further readout steps 29 follow the respective preceding saturation pulses 25 such that different inversion times ensue. Since the further readout steps 29 are in turn applied in the succeeding cardiac cycles in the same heart phase, the saturation pulses 25 are applied in different heart phases for this purpose.

Finally a T1 relaxation time can be determined form the magnetic resonance signals acquired in readout steps 27, 28, 29 by means of the evaluation device 13, said relaxation time being saved in spatially resolved manner in the form of a T1 map.

Figure 3:
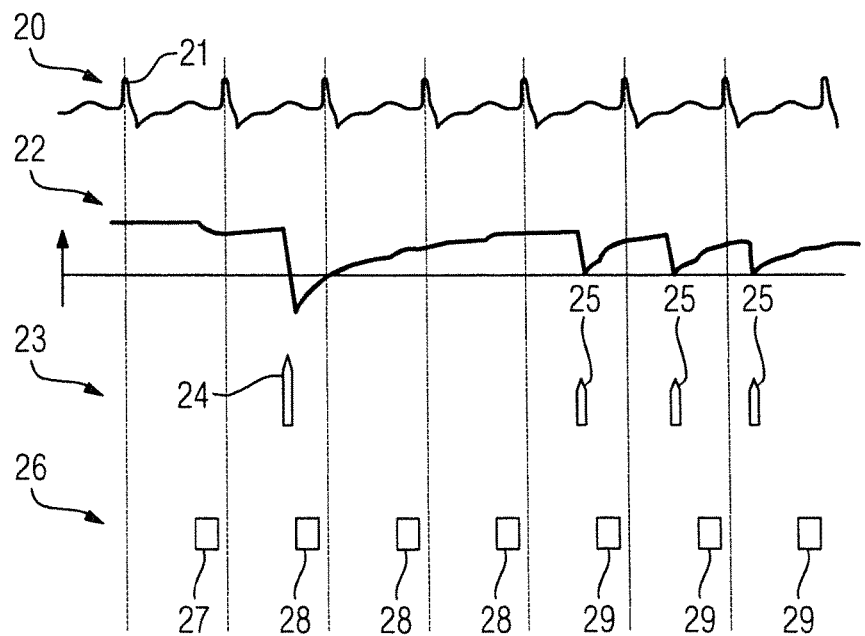
FIG. 3 shows an exposure cycle of an pulse sequence of a second embodiment of the inventive method.

FIG. 3 shows an exposure cycle of an pulse sequence of a second embodiment of an inventive method. The exposure cycle of this pulse sequence differs from the exposure cycle shown in FIG. 2 in that it only comprises seven cardiac cycles. The first four cardiac cycles are in this connection identical to the first four cycles of the exposure cycle shown in FIG. 2. However, in contrast to the exposure cycle shown in FIG. 2, only three saturation pulses and three additional readout steps will then each be applied three heartbeats long. The result is that fewer measurement points will be available for the determination of the T1 relaxation times. However, the exposure cycle shown in FIG. 3 requires a significantly shortened measurement time. In contrast to the exposure cycles shown in FIG. 2 and FIG. 3, an exposure cycle not shown in the figures would be conceivable which only lasts five cardiac cycles and only comprises one saturation pulse 25 with an associated further readout step 29 after the saturation pulse 25. It would also be conceivable to wait only one cardiac cycle after the inversion pulse 24 before applying the first saturation pulse 25, which would lead to an additional shortening of the measurement time. Of course, any additional inventive combinations of the inversion pulses 24, saturation pulses 25 and readout steps 27, 28, 29 are also conceivable.

The exposure cycles of the exposure sequences of the inventive method shown in FIG. 2 and FIG. 3 are executed by the controller 6 together with the magnetic resonance apparatus 5. To this end the controller 6 includes the necessary software and/or computer programs that are stored in a storage unit of the controller 6. The software and/or computer programs embody programming instructions that are designed to execute the inventive method when the computer program and/or the software are executed in the controller 6 by a processing unit of the magnetic resonance apparatus 5.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) image data from a subject, comprising:
    providing a control computer of an MR apparatus, with a pulse sequence comprising at least one exposure cycle that comprises an inversion pulse, that inverts a magnetization of nuclear spins in the subject, one or more saturation pulses, that saturate said magnetization, and one or more readout steps that each include excitation of said nuclear spins and wherein, within said exposure cycle, at least one saturation pulse follows the inversion pulse, and at least one readout step follows the at least one saturation pulse, and occurs prior to said inversion pulse; and
    from said control computer, operating said MR apparatus according to said pulse sequence, while the subject is situated in said MR apparatus, to acquire MR data from said examination object in order to compile a data file containing said MR data, and making said data file available at an output of said control computer in electronic form.

2. A method as claimed in claim 1 comprising providing said computer with said pulse sequence wherein, within said exposure cycle after said inversion pulse, at least two saturation pulses and at least two readout steps occur without an interposed inversion pulse.

3. A method as claimed in claim 2 comprising providing said control computer with said pulse sequence wherein said at least two saturation pulses and said at least two readout steps occur on an alternating basis, and are coordinated with each other to cause different inversion times.

4. A method as claimed in claim 1 comprising:
    detecting a heartbeat of said examination object; and
    from said computer, operating said magnetic resonance apparatus by coordinating execution of said pulse sequence with the detected heartbeat to cause, within said exposure cycle, a first of said one or more saturation pulses to occur within a time period of no more than four cardiac cycles after said inversion pulse.

5. A method as claimed in claim 1 comprising:
    detecting a heartbeat of said examination object; and
    providing said control computer with said pulse sequence comprising a plurality of readout steps, and from said control computer, operating said magnetic resonance apparatus with said plurality of readout steps coordinated to a heartbeat of the examination object, to cause said plurality of readout steps to each take place at consecutive cardiac cycles of a same heart phase of the examination object.

6. A method as claimed in claim 1 comprising providing said control computer with said pulse sequence comprising a plurality of readout steps, and reconstructing a magnetic resonance image from said data file in each of said plurality of readout steps.

7. A method as claimed in claim 6 comprising electronically analyzing said data file to determine a quantitative spatially resolved determination of a T1 relaxation time, and generating a T1 map from the determined T1 relaxation time, for each of the plurality of readout steps.

8. A method as claimed in claim 1 comprising electronically analyzing said data file to determine a quantitative spatially resolved determination of a T1 relaxation time, and generating a T1 map from the determined T1 relaxation time, for at least one of said readout steps.

9. A magnetic resonance (MR) apparatus for acquiring MR data from a subject comprising:
    an MR data acquisition unit
    a control computer provided with a pulse sequence, said pulse sequence comprising at least one exposure cycle that comprises an inversion pulse, that inverts a magnetization of nuclear spins in the subject, one or more saturation pulses that saturate said magnetization, and one or more readout steps that each include excitation of said nuclear spins and wherein, within said exposure cycle, at least one saturation pulse follows the inversion pulse, and at least one readout step follows the at least one saturation pulse, and occurs prior to said inversion pulse; and said control computer being configured to operate said MR data acquisition unit while the subject is situated therein, according to said pulse sequence to acquire MR data from said subject in order to compile a data file containing said MR data, and to make said data file available at an output of said control computer in electronic form.

10. A non-transitory, computer-readable data storage medium encoded with programming instructions, said data storage medium being loaded into a control computer of a magnetic resonance MR apparatus in order to acquire MR data from a subject, and said programming instructions causing said control computer to:

obtain a pulse sequence comprising at least one exposure cycle that comprises an inversion pulse that inverts a magnetization of nuclear spins in the subject, one or more saturation pulses that saturate said magnetization, and one or more readout steps that each include excitation of said nuclear spins and wherein, within said exposure cycle, at least one saturation pulse follows the inversion pulse, and at least one readout step follows the at least one saturation pulse, and occurs prior to said inversion pulse; and operate said MR apparatus, while the subject is situated therein, according to said pulse sequence to acquire MR data from said subject in order to compile a data file containing said MR data, and make said data file available at an output of said control computer in electronic form.

* * * * *